US011107954B2

United States Patent
Ebbecke

(10) Patent No.: US 11,107,954 B2
(45) Date of Patent: Aug. 31, 2021

(54) LIGHT-EMITTING DIODE CHIP, AND METHOD FOR MANUFACTURING A LIGHT-EMITTING DIODE CHIP

(71) Applicant: OSRAM OLED GmbH, Regensburg (DE)

(72) Inventor: Jens Ebbecke, Rohr in Niederbayern (DE)

(73) Assignee: Osram Oled GmbH, Regensburg (DE)

( * ) Notice: Subject to any disclaimer, the term of this patent is extended or adjusted under 35 U.S.C. 154(b) by 0 days.

(21) Appl. No.: 16/621,255

(22) PCT Filed: Jun. 11, 2018

(86) PCT No.: PCT/EP2018/065357
§ 371 (c)(1),
(2) Date: Dec. 11, 2019

(87) PCT Pub. No.: WO2018/228993
PCT Pub. Date: Dec. 20, 2018

(65) Prior Publication Data
US 2020/0111937 A1    Apr. 9, 2020

(30) Foreign Application Priority Data

Jun. 12, 2017   (DE) .................... 10 2017 112 875.1

(51) Int. Cl.
*H01L 33/44*   (2010.01)
*H01L 33/32*   (2010.01)
(Continued)

(52) U.S. Cl.
CPC .......... *H01L 33/44* (2013.01); *H01L 33/0062* (2013.01); *H01L 33/0095* (2013.01);
(Continued)

(58) Field of Classification Search
CPC ..... H01L 33/0095; H01L 33/30; H01L 33/44; H01L 33/32; H01L 33/0062; H01L 2933/0025
See application file for complete search history.

(56) References Cited

U.S. PATENT DOCUMENTS

2002/0173165 A1   11/2002   Kapolnek et al.
2004/0113156 A1    6/2004   Tamura et al.
(Continued)

FOREIGN PATENT DOCUMENTS

| DE | 102015120089 A1 | 5/2017 |
| KR | 20120118171 A | 10/2012 |
| WO | 2015044529 A1 | 4/2015 |

OTHER PUBLICATIONS

International Search Report issued for corresponding international PCT application No. PCT/EP2018/065357, dated Sep. 11, 2018, 4 pages (for informational purpose only).
(Continued)

*Primary Examiner* — Savitri Mulpuri
(74) *Attorney, Agent, or Firm* — Viering, Jentschura & Partner MBB

(57) ABSTRACT

A light-emitting diode chip that includes an epitaxial semiconductor layer sequence having an active region that generates electromagnetic radiation during operation, and a passivation layer comprising magnesium oxide and magnesium nitride. The passivation layer may be applied to a lateral surface of the semiconductor layer sequence, and the passivation layer covering at least the active region.

18 Claims, 5 Drawing Sheets

(51) Int. Cl.
   *H01L 33/30*       (2010.01)
   *H01L 33/00*       (2010.01)
(52) U.S. Cl.
   CPC .............. *H01L 33/30* (2013.01); *H01L 33/32* (2013.01); *H01L 2933/0025* (2013.01)

(56) References Cited

U.S. PATENT DOCUMENTS

| | | | |
|---|---|---|---|
| 2007/0166851 A1* | 7/2007 | Tran | H01L 33/22 438/22 |
| 2009/0311528 A1 | 12/2009 | Robin et al. | |
| 2010/0270570 A1 | 10/2010 | Cheng et al. | |
| 2011/0075694 A1* | 3/2011 | Yoshizumi | H01S 5/0287 372/45.01 |
| 2018/0374994 A1 | 12/2018 | Ebbecke et al. | |

OTHER PUBLICATIONS

German Search Report issued for corresponding DE application No. 10 2017 112 875.1, dated Apr. 26, 2018, 6 pages (for informational purpose only).

* cited by examiner

LIGHT-EMITTING DIODE CHIP, AND METHOD FOR MANUFACTURING A LIGHT-EMITTING DIODE CHIP

CROSS-REFERENCE TO RELATED APPLICATIONS

The present application is a national stage entry according to 35 U. S.C. § 371 of PCT application No.: PCT/EP2018/065357 filed on Jun. 11, 2018; which claims priority to German Patent Application Serial No.: 10 2017 112 875.1, which was filed on Jun. 12, 2017; both of which are incorporated herein by reference in their entirety and for all purposes.

TECHNICAL FIELD

A light-emitting diode chip and a method for producing a light-emitting diode chip are provided.

BACKGROUND

Light-emitting diode chips, in particular based on InGaAlP, often have a low efficiency because of nonradiative recombinations of charge carriers in the active radiation-producing zone on etched side surfaces.

SUMMARY

It is an object of the present invention to provide a light-emitting diode chip which has an increased efficiency in comparison with the prior art. It is furthermore an object of the present invention to provide a method for producing such a light-emitting diode chip.

These objects are achieved by a light-emitting diode chip having the features of patent claim 1 and by a method having the steps of patent claim 10.

Advantageous embodiments and refinements of the light-emitting diode chip and of the method are the subject matter of the respective dependent claims.

A light-emitting diode chip is provided. The light-emitting diode chip includes an epitaxial semiconductor layer sequence having an active zone, which generates electromagnetic radiation during the operation of the light-emitting diode chip.

According to at least one embodiment, the light-emitting diode chip includes a passivation layer including or consisting of magnesium oxide and magnesium nitride. The passivation layer is applied on a side surface of the semiconductor layer sequence and laterally covers at least the active zone of the epitaxial semiconductor layer sequence.

According to at least one embodiment, the passivation layer includes or consists of MgO and $Mg_3N_2$.

It is furthermore also possible for the passivation layer to extend surface-wide over the side surface of the epitaxial semiconductor layer sequence. As an alternative or in addition, the passivation layer may also be arranged at least partially on a first main surface, in particular a light exit surface, of the epitaxial semiconductor layer sequence or of the light-emitting diode chip.

According to at least one embodiment, the passivation layer is arranged in direct contact with a compound semiconductor material of the epitaxial semiconductor layer sequence. In other words, the passivation layer has a common interface with the epitaxial semiconductor layer sequence.

According to at least one embodiment, the side surface of the epitaxial semiconductor layer sequence is produced by etching.

The inventors have established that nonradiative recombinations of charge carriers, i.e. electrons and holes, take place to a greater extent on the side surfaces or side edges, in particular on etched side surfaces, of the active zone of the epitaxial semiconductor layer sequence. Particularly on the side surfaces of the epitaxial semiconductor layer sequence, unsaturated states due to perturbation of the crystal structure, and therefore free valencies or bonding sites, are saturated by the bonding of oxygen. In other words, the compound semiconductor material is oxidized in the region of the side surface of the semiconductor layer sequence. Intermediate states are thereby formed in the band gap, i.e. between the valence and conduction bands, which lead to nonradioactive recombinations of charge carriers. These charge carriers are therefore no longer available for the generation of electromagnetic radiation, which leads to a reduction in the radiation and therefore in the efficiency of the light-emitting diode chip. The idea of the present application is to replace the oxygen bonds of the compound semiconductor material on the side surfaces of the epitaxial semiconductor layer sequence, particularly in the region of the active zone, with other bonds in order to avoid or reduce the intermediate states in the band gap, which result from the oxygen bonding. To this end, a layer including or consisting of magnesium nitride is applied onto the side surface of the semiconductor layer sequence, and this laterally and fully covers at least the active zone of the epitaxial semiconductor layer sequence. Since magnesium has a higher affinity for oxygen than the elements contained in the compound semiconductor material, exchange of oxygen and nitrogen takes place and bonds with nitrogen are formed on the interface with the epitaxial semiconductor layer sequence instead of the bonds of the compound semiconductor material with oxygen. At the same time, magnesium oxide is formed in the layer including the magnesium nitride and this results in a passivation layer including or consisting of magnesium nitride and magnesium oxide. In other words, nitridation of the compound semiconductor material of the epitaxial semiconductor layer sequence takes place at the interface of the epitaxial semiconductor layer sequence and the layer including or consisting of magnesium nitride. Advantageously, the intermediate states in the band gap on the surface of the semiconductor layer sequence in the region of the active zone may thus be avoided or significantly reduced, so that the radiative recombination of charge carriers in the active zone is increased and the efficiency of the light-emitting diode chip is thus increased. In particular, a significant efficiency increase is to be observed when the light-emitting diode chip has a small lateral extent. In a non-limiting embodiment, the light-emitting diode chip has an edge length which does not exceed 500 μm, such as 100 μm.

According to at least one embodiment, nitrides of the compound semiconductor material are present on the side surface of the semiconductor layer sequence, on which the passivation layer is arranged, and therefore on the interface of the epitaxial semiconductor layer sequence and the passivation layer. In other words, bonds of the compound semiconductor material with nitrogen are present.

According to one non-limiting embodiment, the epitaxial semiconductor layer sequence is based on a III/V compound semiconductor material.

The III/V compound semiconductor material may be a phosphide compound semiconductor material. A phosphide compound semiconductor material is a compound semiconductor material which contains phosphorus.

In one non-limiting embodiment, the III/V compound semiconductor material is a phosphide compound semiconductor material of the system $In_xAl_yGa_{1-x-y}P$ with $0 \leq x \leq 1$, $0 \leq y \leq 1$ and $x+y \leq 1$. In particular, the epitaxially grown semiconductor layer sequence includes one of these materials or consists of one of these materials. Advantageously, magnesium with a standard electrode potential of $E°=-2.7$ V has a higher affinity for oxygen than aluminum, gallium, phosphorus and indium. For example, aluminum has a standard electrode potential of $E°=-1.66$ V. After the application of the layer including or consisting of magnesium nitride on the side surface of the semiconductor layer sequence, nitridation of $In_xAl_yGa_{1-x-y}P$ takes place with the formation of indium-nitrogen, aluminum-nitrogen, gallium-nitrogen and/or phosphorus-nitrogen bonds on the side surface of the epitaxial semiconductor layer sequence. At the same time, magnesium oxide is formed in the layer including the magnesium nitride, and this results in a passivation layer including or consisting of magnesium nitride and magnesium oxide. Intermediate states in the band gap, which result from the oxygen bonding to gallium, indium, phosphorus and/or aluminum, in particular from oxygen bonding to aluminum, may thus be avoided or reduced. The light-emitting diode chip therefore advantageously has a high efficiency.

According to at least one embodiment, the epitaxial semiconductor layer sequence includes indium-nitrogen, aluminum-nitrogen, phosphorus-nitrogen and/or gallium-nitrogen bonds on the interface with the passivation layer.

The passivation layer has a layer thickness of from 1 nm inclusive to 1000 nm inclusive, such as between 5 nm inclusive and 100 nm inclusive.

The efficiency increase is particularly effective in the case of a light-emitting diode chip which has a relatively high ratio of the side surface to the light exit surface. The ratio of the side surface to the light exit surface of the light-emitting diode chip is at least 0.01.

According to at least one embodiment, a protective layer including or consisting of silicon nitride, in particular including or consisting of $Si_3N_4$, is arranged over the passivation layer. In this way, the light-emitting diode chip is protected against oxygen and/or moisture.

According to at least one embodiment, the protective layer has a layer thickness of from 1 nm inclusive to 1000 nm inclusive, such as from 5 nm inclusive to 100 nm inclusive.

A method for producing a light-emitting diode chip is provided. All features of the light-emitting diode chip also apply for the method for producing a light-emitting diode chip, and vice versa.

The method for producing a light-emitting diode chip includes:

A) providing an epitaxially grown semiconductor layer sequence having an active zone, which is suitable for generating electromagnetic radiation, B) applying a layer including or consisting of magnesium nitride onto a side surface of the epitaxial semiconductor layer sequence. In particular, the layer is applied in such a way that it laterally covers at least the active zone of the epitaxial semiconductor layer sequence.

D) heat-treating the compound of the semiconductor layer sequence and the layer including magnesium nitride, produced in step B), to form a passivation layer including magnesium oxide and magnesium nitride. The temperature for the heat treatment lies between 100 and 800° C., inclusive.

During the heat treatment in step D), nitridation of the compound semiconductor material of the epitaxial semiconductor layer sequence over which the layer including or consisting of magnesium nitride has been applied, takes place. Since magnesium has a higher affinity for oxygen than the elements contained in a compound semiconductor material, in particular exchange of oxygen and nitrogen takes place and bonds with oxygen are formed on the interface with the epitaxial semiconductor layer sequence instead of the bonds of the compound semiconductor material with oxygen. At the same time, magnesium oxide is formed in the layer including the magnesium nitride, and this results in a passivation layer including or consisting of magnesium nitride and magnesium oxide. The exchange of oxygen and nitrogen is furthermore promoted by the higher stability of magnesium oxide in comparison with magnesium nitride.

According to at least one embodiment of the method, at least parts of the side surface of the semiconductor layer sequence are produced by etching, in particular by dry etching. This is also referred to as mesa etching. The side surface of the semiconductor layer sequence may initially be produced partially by etching, while a further part of the side surface may be produced by another separating process, for example fracturing, sawing or laser cutting. Particularly, the active zone of the semiconductor layer sequence is separated by etching.

According to at least one embodiment, the epitaxial semiconductor layer sequence is based on a phosphide compound semiconductor material, and indium-nitrogen, phosphorus-nitrogen, aluminum-nitrogen and/or gallium-nitrogen bonds are formed in step D) on the interface between the semiconductor layer sequence and the passivation layer. In particular, after step D) no or scarcely any indium-oxygen, phosphorus-oxygen, aluminum-oxygen and/or gallium-oxygen bonds are present on the interface between semiconductor layer sequence and the passivation layer.

According to at least one embodiment, the magnesium nitride is applied in step B) by sputtering.

According to at least one embodiment, the magnesium nitride is applied in step B) in direct contact onto the side surface of the epitaxial semiconductor layer sequence.

According to at least one embodiment, a step C) is carried out between step B) and step D): C) applying a protective layer onto the layer including or consisting of silicon nitride, such as $Si_3N_4$. If method step C) is carried out, a compound produced in step C) is heat-treated in step D).

BRIEF DESCRIPTION OF THE DRAWINGS

In the embodiments and figures, components which are the same or of the same type, or which have the same effect, are respectively provided with the same references. The elements represented and their size ratios with respect to one another are not to be regarded as to scale. Rather, individual elements, in particular layer thicknesses, may be represented exaggeratedly large for better understanding.

DETAILED DESCRIPTION

Figure 1A:
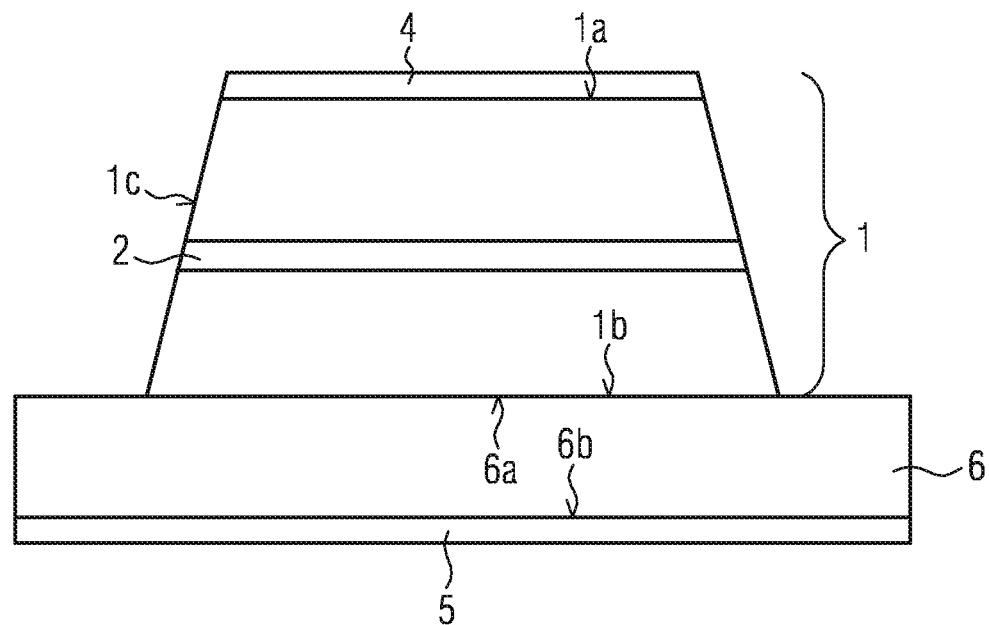
FIGS. 1A and 1B show light-emitting diode chips without a passivation layer.

The light-emitting diode chip according to FIG. 1a includes an epitaxially grown semiconductor layer sequence 1. The epitaxial semiconductor layer sequence 1 includes an active zone 2, which is adapted to generate electromagnetic radiation S during operation of the light-emitting diode chip. The epitaxial semiconductor layer sequence 1 is based on a phosphide compound semiconductor material of the formula $In_xAl_yGa_{1-x-y}P$ with $0 \leq x \leq 1$, $0 \leq y \leq 1$ and $x+y \leq 1$. The side surface 1c of the semiconductor layer sequence has been produced by dry etching. The side surface 1c is distinguished in the present case in that it is formed obliquely with respect to a midaxis of the light-emitting diode chip. The epitaxial semiconductor layer sequence 1 is arranged on a substrate 6, example made of GaAs. In particular, the epitaxial semiconductor layer sequence 1 is arranged on a first main surface 6a of the substrate, while a second electrical contact 5 is arranged on a second main surface 6b of the substrate. A first electrical contact 4 is arranged over a first main surface 1a of the semiconductor layer sequence, which in particular also represents the light exit surface. For example, the first electrical contact 4 is a p-contact and the second electrical contact 5 is an n-contact.

Figure 1B:
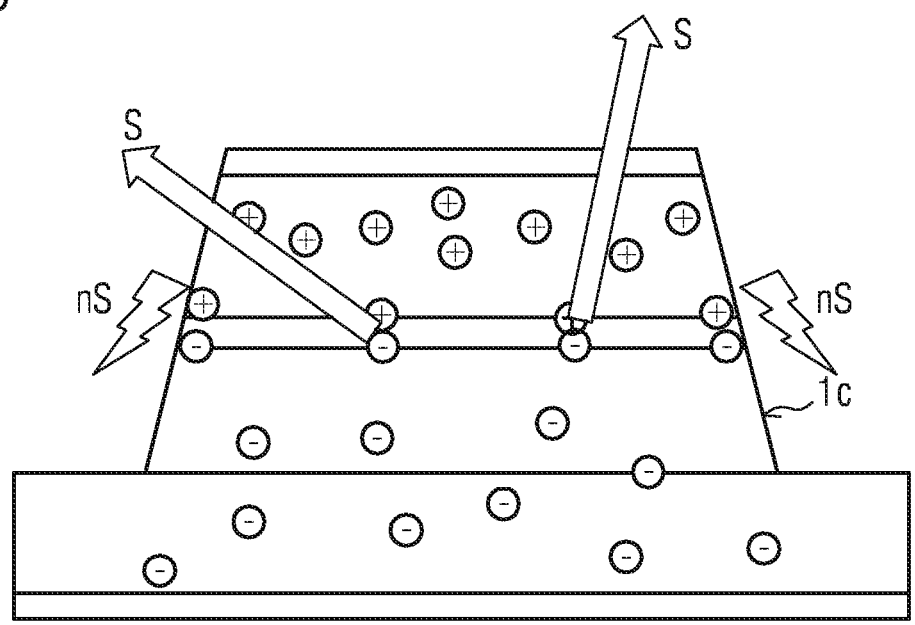

FIG. 1b shows the light-emitting diode chip represented in FIG. 1a during operation. In particular by the etching of the side surfaces 1c, the crystal system, or the crystal structure, of the compound semiconductor material is perturbed and free valencies, or bonding sites, are formed, which in particular are saturated by oxygen. In particular, aluminum-oxygen bonds are formed since aluminum has a particularly high affinity for oxygen. In the active zone 2 of the light-emitting diode chip, negative charge carriers, i.e. electrons, and positive charge carriers, i.e. holes, recombine with the emission of electromagnetic radiation S. On the side surfaces of the active zone, nonradiative recombinations nS of the charge carriers take place to an increased extent. This is attributable to the formation of intermediate states within the band gap, which result from the free bonding sites of the compound semiconductor material, which are saturated with oxygen. This leads to efficiency losses of the light-emitting diode chip. Above all, this loss is large when the light-emitting diode chip has a smaller lateral extent.

In the method represented in FIGS. 2a to 2f, an epitaxially grown semiconductor layer sequence 1 is initially provided with an active zone 2. The active zone 2 is in this case suitable for generating electromagnetic radiation during operation of the light-emitting diode chip. The semiconductor layer sequence 1 is based on a phosphide compound semiconductor material of the formula $In_xAl_yGa_{1-x-y}P$ with $0 \leq x \leq 1$, $0 \leq y \leq 1$ and $x+y \leq 1$. The active zone 2 is based on $In_xAl_yGa_{1-x-y}P$ with $0 \leq x \leq 1$, $0 \leq y \leq 1$ and $x+y \leq 1$, the n-conductive zone 7 on $In_xAl_yP$ with $0<x<1$, $0<y<1$ and $x+y=1$, and the p-conductive zone 8 on $In_xAl_yP$ with $0<x<1$, $0<y<1$ and $x+y=1$. The side surface 1c of the semiconductor layer sequence is produced by dry etching. The side surface 1c is formed obliquely with respect to a midaxis of the light-emitting diode chip. In particular, the crystal system of the compound semiconductor material is interrupted, or perturbed, by the etching of the side surface 1c, and free bonding sites are formed, which are saturated by oxygen. In particular, indium-oxygen, aluminum-oxygen, gallium-oxygen and/or phosphorus-oxygen bonds are formed. On the side surfaces 2a of the active zone, this leads to undesired nonradiative recombinations of charge carriers by the formation of intermediate states within the band gap. This is illustrated in the energy diagram of FIG. 2b. There, the energy E of the valence band Ev and of the conduction band Ec of the compound semiconductor material of the active zone 2 and the intermediate states, resulting from gallium-oxygen bonds and aluminum-oxygen bonds, within the band gap between the valence and conduction bands are shown. The efficiency loss due to nonradiative recombinations of the charge carriers is, in particular, established during the wet and dry etching of the side surfaces of the semiconductor layer sequence.

Figure 2A:
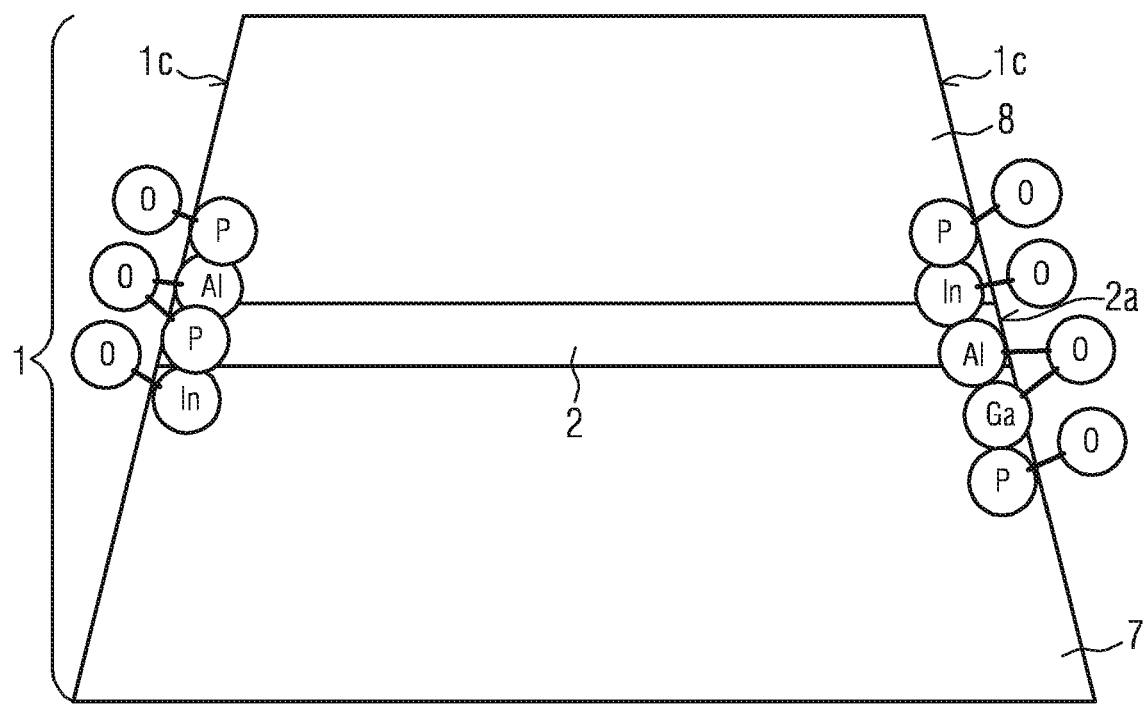
FIGS. 2A to 2F schematically show a method for producing a light emitting diode chip.
Figure 2B:
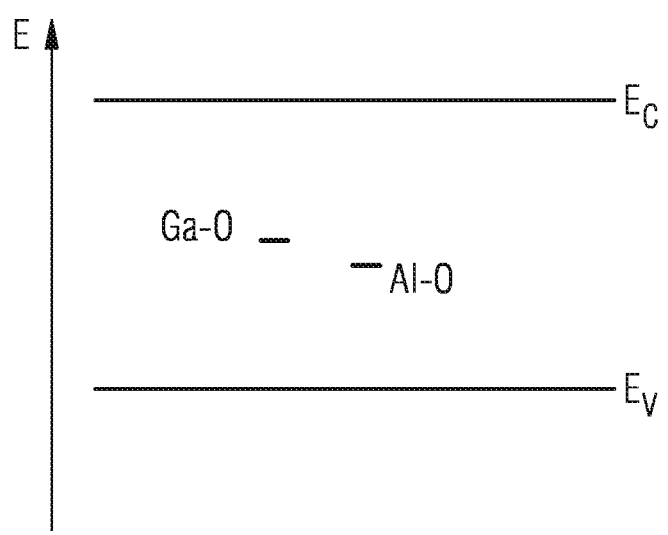
Figure 2C:
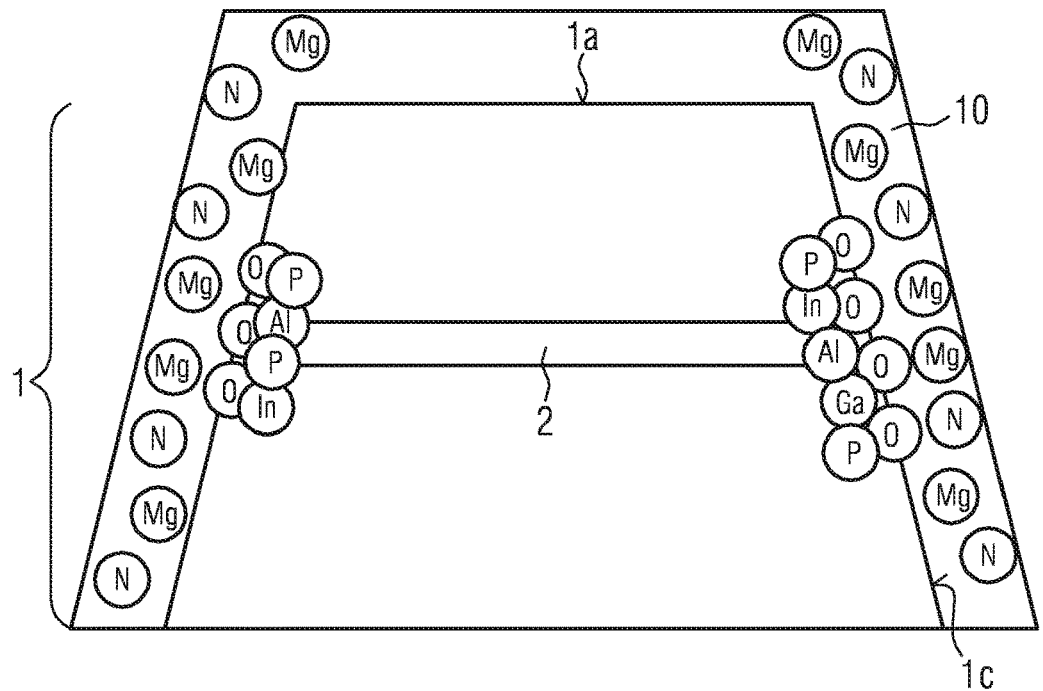
Figure 2D:
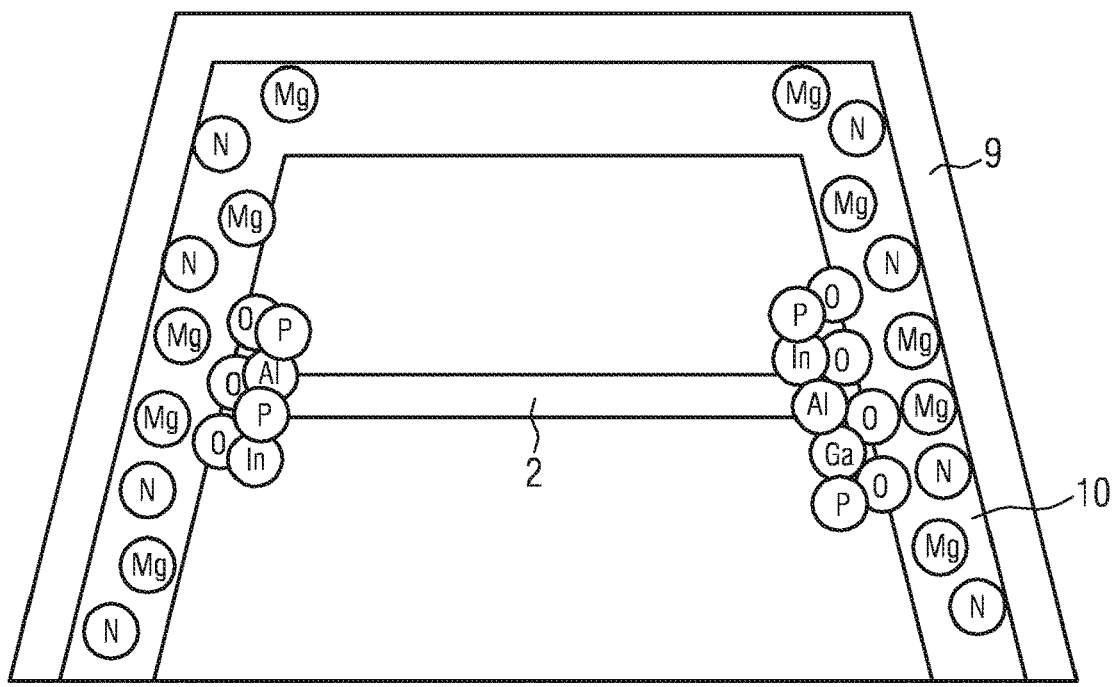

In the step shown in FIG. 2c of the method, a layer 10 including or consisting of magnesium nitride, such as $Mg_3N_2$, is applied surface-wide over the side surface 1c of the epitaxial semiconductor layer sequence 1 and the first main surface 1a of the semiconductor layer sequence, in particular the light exit surface, by sputtering. In particular, the layer 10 laterally covers the active zone 2. In a next step, as shown in FIG. 2d, a protective layer 9 is optionally applied over the layer 10. The protective layer 9 is applied surface-wide over the side surface of the epitaxial semiconductor layer sequence 1c and the first main surface 1a, and includes or consists of silicon nitride.

Figure 2E:
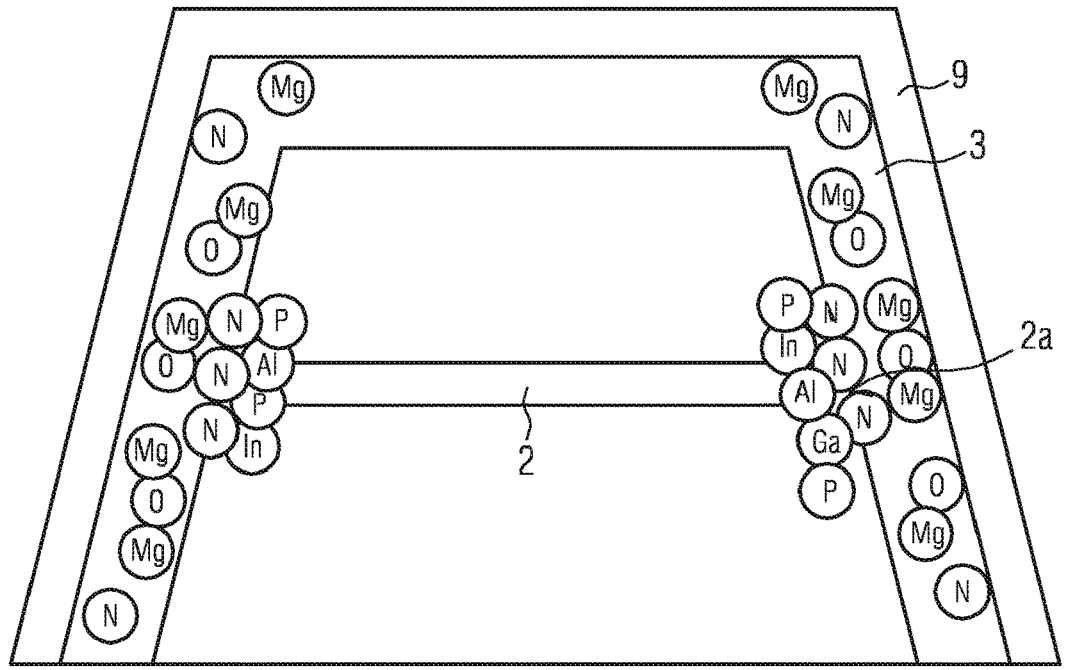

In a next step of the method, the compound of the epitaxial semiconductor layer sequence 1, the layer 10 and the protective layer 9 is heat-treated at a temperature of 100 to 800° C., for example 300° C. Magnesium has a higher affinity for oxygen than the elements aluminum, indium, gallium and phosphorus contained in the compound semiconductor material. During the heat treatment, nitridation of the compound semiconductor material of the epitaxial semiconductor layer sequence 1, over which the layer 10 is arranged, takes place with the formation of indium-nitrogen, aluminum-nitrogen, gallium-nitrogen and/or phosphorus-nitrogen bonds. At the same time, magnesium oxide is formed in the layer 10, and a passivation layer 3 including or consisting of magnesium oxide and magnesium nitride, such as MgO and $Mg_3N_2$, is formed from the layer 10 during the heat treatment (FIG. 2e). Advantageously, the intermediate states represented in FIG. 2b in the band gap on the side surface 2a of the active zone may thus be avoided or significantly reduced, so that the radiative recombination of charge carriers in the active zone 2 is increased and the efficiency of the light-emitting diode chip thus increases.

Figure 2F:
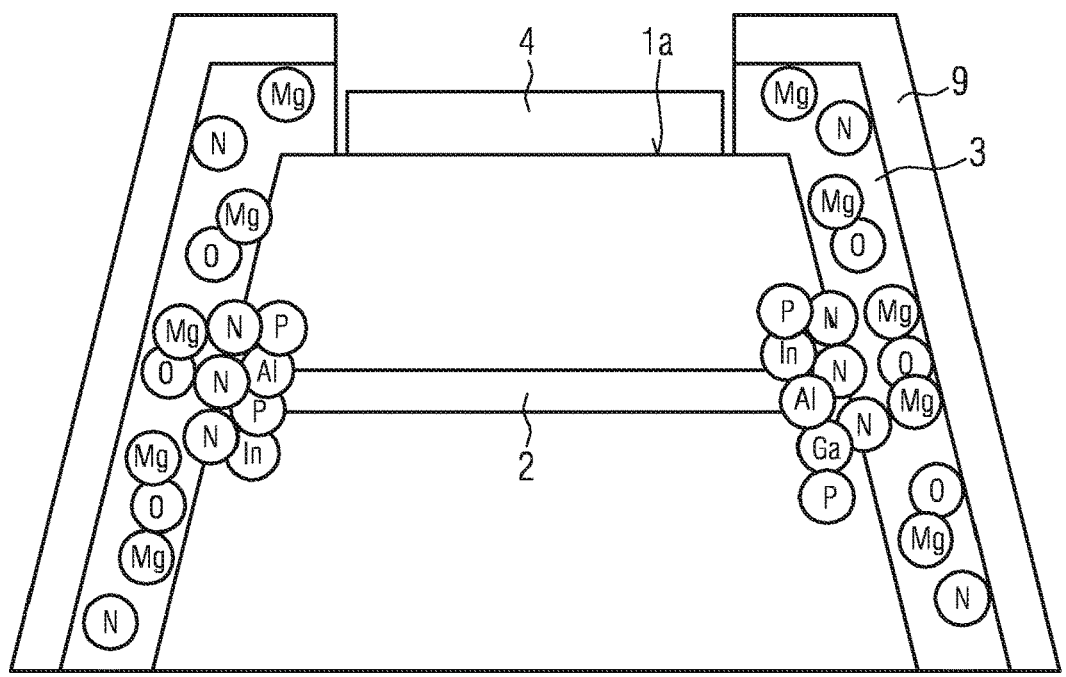

In a further step, the passivation layer 3 and the protective layer 9 may be removed at least partially from the first main surface 1a, for example by etching, and a first electrical contact 4 may be applied on the first main surface 1a and in direct mechanical and electrical contact therewith, as is represented in FIG. 2f.

Figure 3:
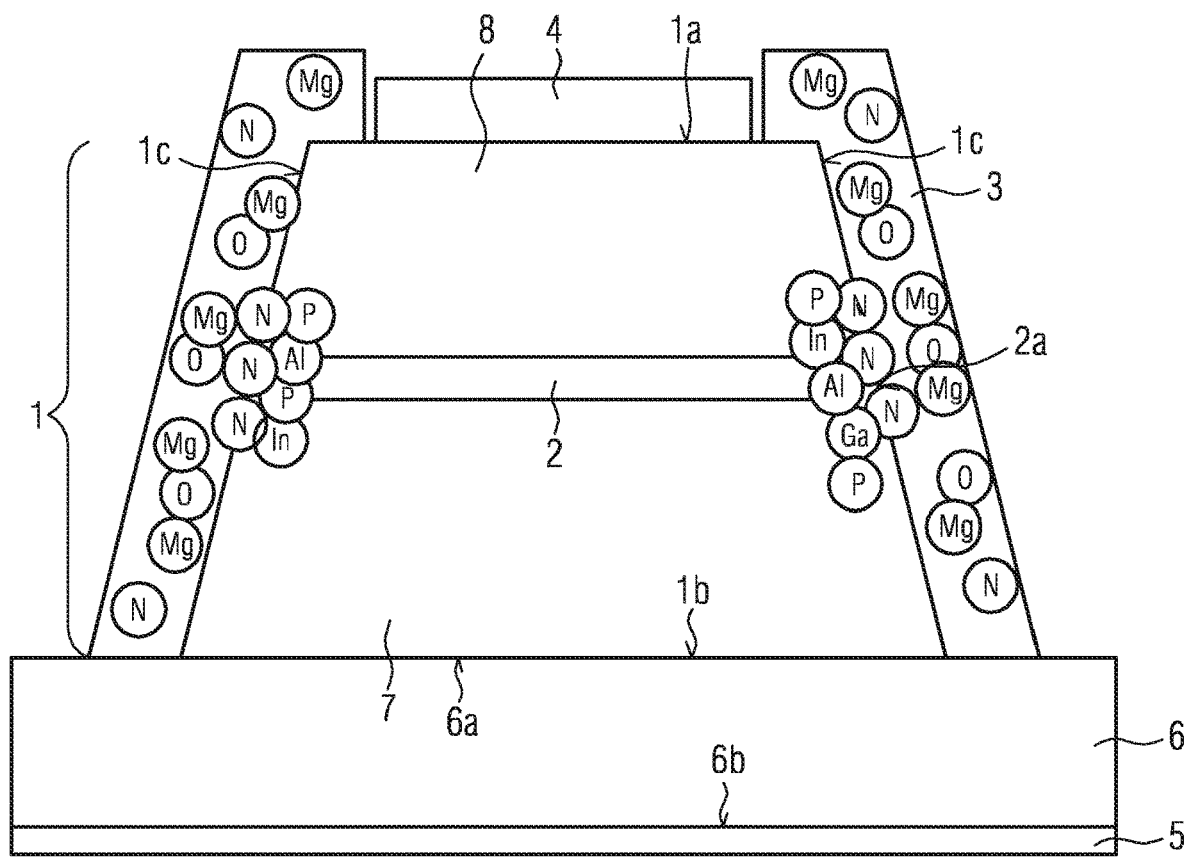
FIG. 3 shows a schematic side view of a light-emitting diode chip.

FIG. 3 shows an embodiment of a light-emitting diode chip. The light-emitting diode chip includes an epitaxially grown semiconductor layer sequence 1. The epitaxial semiconductor layer sequence 1 includes an active zone 2, which is adapted to generate electromagnetic radiation S during operation of the light-emitting diode chip in particular with a wavelength of about 620 nanometers. The epitaxial semiconductor layer sequence 1 is based on a phosphide compound semiconductor material of the formula $In_xAl_yGa_{1-x-y}P$ with $0 \leq x \leq 1$, $0 \leq y \leq 1$ and $x+y \leq 1$. The active zone 2 is based on $In_xAl_yGa_{1-x-y}P$ with $In_xAl_yGa_{1-x-y}P$ with $0<x<1$, $0<y<1$ and $x+y<1$, the n-conductive zone 7 on $In_xAl_yP$ with $0<x<1$, $0<y<1$ and $x+y=1$, and the p-conductive zone 8 on $In_xAl_yP$ with $0<x<1$, $0<y<1$ and $x+y=1$. The side surface of the semiconductor layer sequence 1c is produced by dry etching. The side surface 1c is distinguished in the present case by being formed obliquely with respect to a midaxis of the light-emitting diode chip. The epitaxial semiconductor layer sequence 1 is arranged on a substrate 6, for example formed from GaAs. In particular, the epitaxial semiconductor layer sequence 1 is arranged on a first main surface 6a of the substrate, while a second electrical contact 5 is arranged on a second main surface 6b of the substrate. A first electrical contact 4 is arranged over a first main surface 1a of the semiconductor layer sequence, which in particular also represents the light exit surface. The first electrical contact 4 is a p-contact, and the second electrical contact 5 is an n-contact. A passivation layer 3 including or consisting of magnesium oxide and magnesium nitride is arranged on the side surface 1c of the epitaxial semiconductor layer sequence and on parts of the first main surface 1a of the semiconductor layer sequence. In particular, the passivation layer 3 extends over the side surface 2a of the active zone. The passivation layer 3 has, for example, a layer thickness of 50 nm. Indium-nitrogen, aluminum-nitrogen, gallium-nitrogen and/or phosphorus-nitrogen bonds are present on the interface of the semiconductor layer sequence 1 and the passivation layer 3.

The description with the aid of the embodiments does not restrict the invention thereto. Rather, the invention includes any new feature and any combination of features, which in particular involves any combination of features in the patent claims, even if this feature or this combination is not itself explicitly indicated in the patent claims or exemplary embodiments.

LIST OF REFERENCES 1 epitaxial semiconductor layer sequence or epitaxially grown semiconductor layer sequence
1a first main surface of the semiconductor layer sequence or a light exit surface
1b second main surface of the semiconductor layer sequence
1c side surface of the semiconductor layer sequence
2 active zone
2a side surface of the active zone
3 passivation layer
4 first electrical contact
5 second electrical contact
6 substrate
6a first main surface of the substrate
6b second main surface of the substrate
7 n-conductive zone
8 p-conductive zone
9 protective layer
10 layer including magnesium nitride
S electromagnetic radiation
E energy
Ec energy of valence band
Ec energy of conduction band
nS nonradiative recombination

The invention claimed is:

1. A light-emitting diode chip comprising:
an epitaxial semiconductor layer sequence comprising an active zone; wherein the epitaxial semiconductor layer sequence comprises a III/V compound semiconductor material comprising nitrides that are present on an interface of the epitaxial semiconductor layer sequence and the passivation layer; wherein the epitaxial semiconductor layer sequence generates electromagnetic radiation during operation; and
a passivation layer comprising magnesium oxide and magnesium nitride; wherein the passivation layer is applied on a side surface of the semiconductor layer sequence and the passivation layer covers at least the active zone, the passivation layer comprising magnesium oxide and magnesium nitride having a common interface with the epitaxial semiconductor layer sequence.

2. The light-emitting diode chip as claimed in claim 1, wherein the III/V compound semiconductor material comprises a phosphide compound semiconductor material.

3. The light-emitting diode chip as claimed in claim 2, wherein the phosphide compound semiconductor material comprises $In_xAl_yGa_{1-x-y}P$ with $0 \leq x \leq 1$, $0 \leq y \leq 1$ and $x+y \leq 1$.

4. The light-emitting diode chip as claimed in claim 3, wherein the semiconductor layer sequence comprises indium-nitrogen bonds, aluminum-nitrogen bonds, phosphorus-nitrogen bonds, gallium-nitrogen bonds, or combinations thereof on the interface with the passivation layer.

5. The light-emitting diode chip as claimed in claim 1, wherein the passivation layer has a layer thickness ranging from 1 nm inclusive to 1000 nm inclusive.

6. The light-emitting diode chip as claimed in claim 1, wherein
an edge length of the light-emitting diode chip does not exceed 500 μm.

7. The light-emitting diode chip as claimed in claim 1, further comprising a protective layer comprising silicon nitride; wherein the protective layer is arranged over the passivation layer.

8. A method for producing a light-emitting diode chip, comprising:
providing an epitaxial semiconductor layer sequence having an active zone, which is suitable for generating electromagnetic radiation;
applying a layer comprising magnesium nitride onto a side surface of the semiconductor layer sequence, the magnesium nitride being applied in direct contact onto the side surface of the semiconductor layer sequence;
heat-treating a compound of the semiconductor layer sequence and the layer comprising magnesium nitride, to form a passivation layer comprising magnesium oxide and magnesium nitride.

9. The method as claimed in claim 8,
wherein the epitaxial semiconductor layer sequence comprises a phosphide compound semiconductor material $In_xAl_yGa_{1-x-y}P$ with $0 \leq x \leq 1$, $0 \leq y \leq 1$ and $x+y \leq 1$, and indium-nitrogen bonds, phosphorus-nitrogen bonds, aluminum-nitrogen bonds, gallium-nitrogen bonds, or combinations thereof are formed on the interface between the semiconductor layer sequence and the passivation layer.

10. The method as claimed in claim 8,
further comprising producing the side surface of the semiconductor layer sequence by etching.

11. The method as claimed in claim 8,
wherein the magnesium nitride is applied by sputtering.

12. The method as claimed in claim 8,
further comprising applying a protective layer onto the layer comprising magnesium nitride prior to forming the passivation layer.

13. A light-emitting diode chip comprising:
an epitaxial semiconductor layer sequence comprising an active zone; wherein the epitaxial semiconductor layer sequence comprises a III/V compound semiconductor material comprising a phosphide compound semiconductor material that is present on an interface of the epitaxial semiconductor layer sequence and the passivation layer; wherein the epitaxial semiconductor layer sequence generates electromagnetic radiation during operation; and
a passivation layer comprising magnesium oxide and magnesium nitride; wherein the passivation layer is applied on a side surface of the semiconductor layer sequence and the passivation layer covers at least the active zone, the passivation layer comprising magnesium oxide and magnesium nitride having a common interface with the epitaxial semiconductor layer sequence.

14. The light-emitting diode chip as claimed in claim 13, wherein the phosphide compound semiconductor material comprises $In_xAl_yGa_{1-x-y}P$ with $0 \leq x \leq 1$, $0 \leq y \leq 1$ and $x+y \leq 1$.

15. The light-emitting diode chip as claimed in claim 13, wherein the semiconductor layer sequence comprises indium-nitrogen bonds, aluminum-nitrogen bonds, phosphorus-nitrogen bonds, gallium-nitrogen bonds, or combinations thereof on the interface with the passivation layer.

16. The light-emitting diode chip as claimed in claim 13, wherein the passivation layer has a layer thickness ranging from 1 nm inclusive to 1000 nm inclusive.

17. The light-emitting diode chip as claimed in claim 13, wherein
an edge length of the light-emitting diode chip does not exceed 500 μm.

18. The light-emitting diode chip as claimed in claim 13, further comprising a protective layer comprising silicon nitride; wherein the protective layer is arranged over the passivation layer.

* * * * *